United States Patent
Su et al.

(10) Patent No.: US 6,552,360 B1
(45) Date of Patent: Apr. 22, 2003

(54) METHOD AND CIRCUIT LAYOUT FOR REDUCING POST CHEMICAL MECHANICAL POLISHING DEFECT COUNT

(75) Inventors: Chun-Lien Su, Tainan Hsien (TW);
Chi-Yuan Chin, Taipei (TW);
Ming-Shang Chen, Hsinchu (TW);
Tsung-Hsien Wu, Hsinchu (TW);
Yih-Shi Lin, Kaohsiung (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/054,985

(22) Filed: Jan. 25, 2002

(51) Int. Cl.$^7$ .............................................. H01L 23/58
(52) U.S. Cl. ..................... 257/48; 438/626; 438/690; 438/691; 438/692; 438/139; 438/759
(58) Field of Search ................... 438/626, 690, 438/691, 692, 139, 759; 257/48

(56) References Cited

U.S. PATENT DOCUMENTS

| | | | | |
|---|---|---|---|---|
| 5,885,856 A | * | 3/1999 | Gilbert et al. | 438/129 |
| 2002/0022314 A1 | * | 2/2002 | Tuan et al. | 438/239 |

* cited by examiner

Primary Examiner—Tom Thomas
Assistant Examiner—Thomas Magee

(57) ABSTRACT

A method and a circuit layout on a substrate of a semiconductor wafer, suitable for reducing defects during a chemical mechanical polishing process. On the substrate, the circuit layout comprises a plurality of strips of first circuit structure and at least two strips of second circuit structure located on the substrate. Each of the strips of second circuit structure respectively links the front end and the rear end of the plurality of strips of the first circuit structure for the purpose of averaging polishing pressure performed upon the front end and the rear end of the plurality of strips of the first circuit structure during the chemical mechanical polishing process for reducing defects.

9 Claims, 6 Drawing Sheets

METHOD AND CIRCUIT LAYOUT FOR REDUCING POST CHEMICAL MECHANICAL POLISHING DEFECT COUNT

FIELD OF THE INVENTION

The present invention generally relates to a circuit layout of a semiconductor memory, and more specifically, to a circuit layout of a semiconductor memory and a method for reducing defects of chemical mechanical polishing process.

BACKGROUND OF THE INVENTION

Chemical mechanical polishing (CMP, or chemical mechanical planarization) is a planarization method of a semiconductor wafer's surface as well as one of the most valuable technology of manufacturing integrated circuits in recent years. It is also the critical technology of precision manufacture in the future. The CMP technology was successfully developed, as developing CMOS by IBM company in 1985. The CMP technology is utilized to planarize dielectric layers or metal layers, concave or convex upon the wafer's surface.

As the integrated circuit device is becoming smaller, with multi-layer conductive lines and with high density, the process limitation of the depth of focus (DOF) in the photolithography process is also becoming higher. Especially as semiconductor products, such as RAM or logical circuits, have three, four or more metal layers, the planaration technology is becoming more important than before. The CMP technology is so called because of mechanical pressure of the polishing head exerted on the wafer's surface, as well as the chemical reaction of polishing slurry reacting on the wafer's surface.

In the CMP equipment, the polishing head is used to press the wafer on the polishing pad and to drive the wafer rotating, while the polishing pad rotates in the opposite direction. During polishing, the polishing slurry, comprising polishing particles, will be delivered between the wafer and the polishing pad. The parameters having influences upon the CMP process comprising: the polishing pressure exerted by polishing heads and topography of wafers, rotation speeds of wafers and polishing heads, compositions of polishing particles and polishing slurry and the material of the polishing pad and its abrasion hardness, and so forth.

Referring to FIG. 1, a top view diagram is illustrated to show dielectric and conductive layers convex upon a semiconductor wafer. More specifically, in one of circuit structure layers on the wafer's substrate 10, there are a plurality of parallel strips of circuit structure 20 convex upon the semiconductor wafer. The convex circuit structure 20 can be, for example, control gates, i.e., word lines, which can rewrite data into flash memory cells by controlling the control gate's voltage. Diffusion areas 30 are located on substrate 10 between two strips of circuit structure 20 and are utilized to form source regions and drain regions. In addition, an isolating structure 40 is fabricated in the substrate 10 to isolate active regions for each memory cell. The isolating structure 40 can be a field oxide layer formed by LOCOS method, and preferably be a shallow trench isolation (STI) structure.

Continue to refer FIG. 1, four parallel strips of circuit structure 20 is shown. In the process of CMP, the pressure exerted on the front ends and the rear ends of the four strips of circuit structure 20 by the polishing head is not identical with on the other parts. Compared with the other parts, the force directions, on the front ends and the rear ends, are not uniform and come from many directions. Furthermore, the stresses of both ends are also larger than of the other parts. Accordingly, in the CMP process, corners of the front ends and the rear ends of the strips of circuit structure 20 are easily destroyed.

The method to improve the CMP process defects has two ways. One is to improve the control method of the CMP process conditions, such as the uniform polishing pressure, compositions of polishing particles or materials of the polishing pad. The other is to improve the structure strength of wafer's circuits for reduce the possibility of generating defects in the CMP process to promote the yield and throughput.

SUMMARY OF THE INVENTION

According to the above mentioned, defects are easily formed in the CMP process on semiconductor wafer's structure and result in semiconductor device's performance degradation. Therefore, it is an objective of this invention to provide a process and a circuit layout of a semiconductor memory suitable for a chemical mechanical polishing process.

It is another objective of this invention to provide a circuit layout of a semiconductor memory suitable for a chemical mechanical polishing process to reduce defects in the CMP process. The circuit layout on a semiconductor wafer's substrate comprises a plurality of strips of first circuit structure located and at least two strips of second circuit structure, respectively linking the front end and the rear end of first circuit structure, utilizing to average polishing pressure performing upon the front end and the rear end of first circuit structure during the chemical mechanical polishing process for reducing defects occurred.

The present invention also provide a method of forming a circuit layout on a substrate of a semiconductor wafer, suitable for reducing defects during a chemical mechanical polishing process. The method comprises to form a plurality of strips of first circuit structure located on the substrate of the semiconductor wafer. Then, form at least two strips of second circuit structure located on the substrate of the semiconductor wafer, wherein each of the two strips of second circuit structure respectively links the front end and the rear end of the plurality of strips of the first circuit structure, utilizing to average polishing pressure performed upon the front end and the rear end of the plurality of strips of the first circuit structure during a chemical mechanical polishing process for reducing defects occurred.

BRIEF DESCRIPTION OF THE DRAWINGS

For a more complete understanding of the invention, references are made to the following Detailed Description of the Preferred Embodiment taken in connection with the accompanying drawings in which.

DETAILED DESCRIPTION OF THE PREFERRED EMBODIMENT

The present invention provides a circuit layout of a semiconductor device to enhance the structure strength thereof and also to reduce the possibility of forming defects in the CMP process. A preferred embodiment will be disclosed to show the spirit of the present invention, but not to limit it.

Figure 2A:
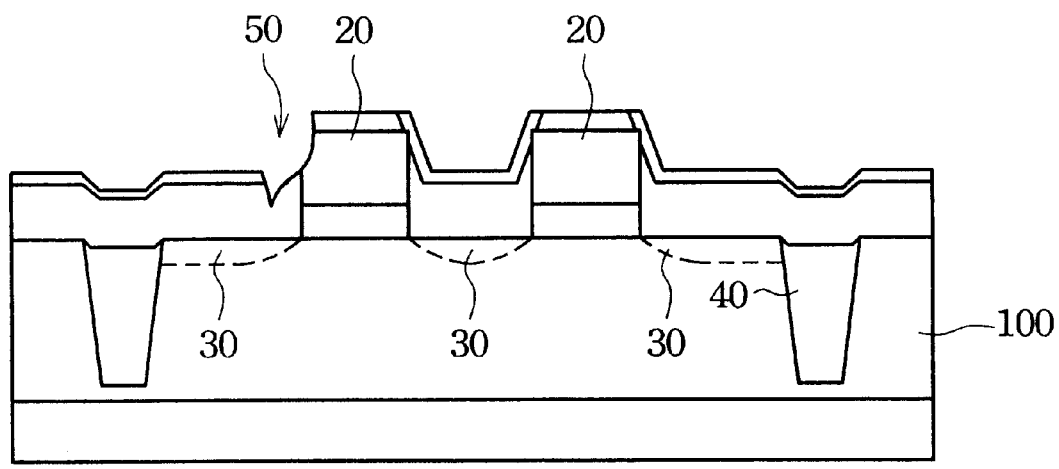
FIG. 2A schematically illustrates a cross section view near the front end or the rear end of a strip of circuit structure 20.
Figure 2B:
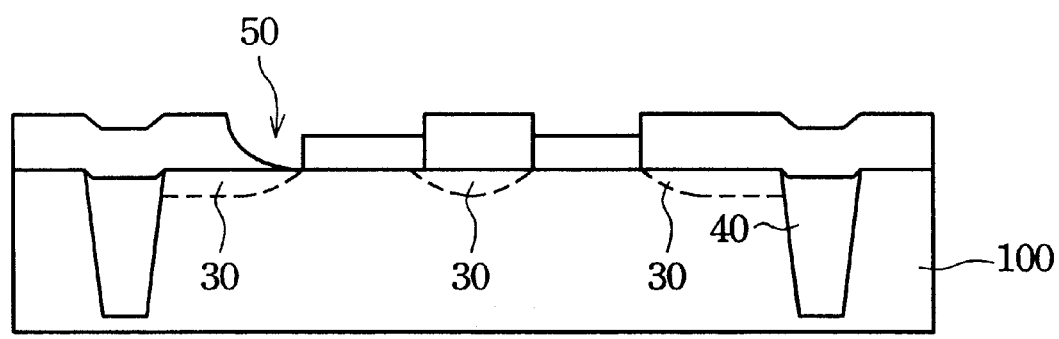
FIG. 2B schematically illustrates a cross section view of the destroyed corner 50 in the proceeding etching process near the front end or the rear end of a strip of circuit structure 20.

Please referring to FIG. 2A, a cross section near the front end or the rear end of a strip of circuit structure 20 is illustrated. A corner 50 of the strip of circuit structure 20 is destroyed by improper polishing force exerted by a polishing pad or polishing slurry in the CMP process. Moreover, the destroyed corner 50 will be further enlarged in the proceeding etching process, as shown in FIG. 2B. Therefore, the designed performance of the semiconductor device will degrade, or even fail.

Figure 3:
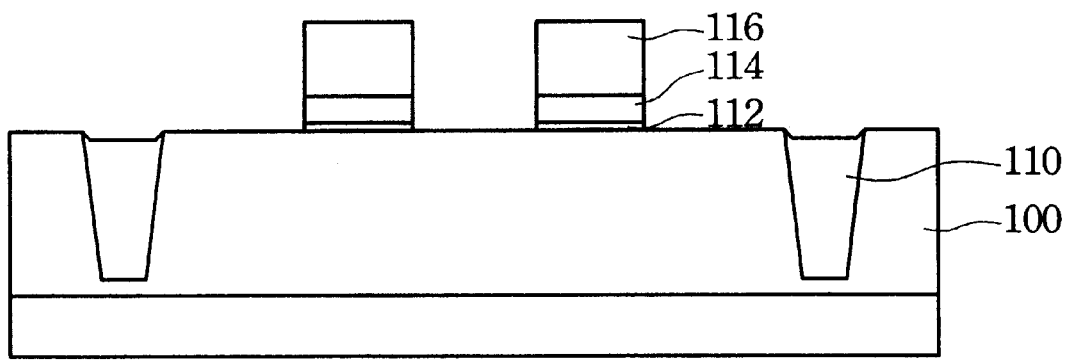
FIGS. 3A–3F schematically illustrates cross sectional views of fabricating a flash memory cell according to the application of the present invention.
Figure 3:
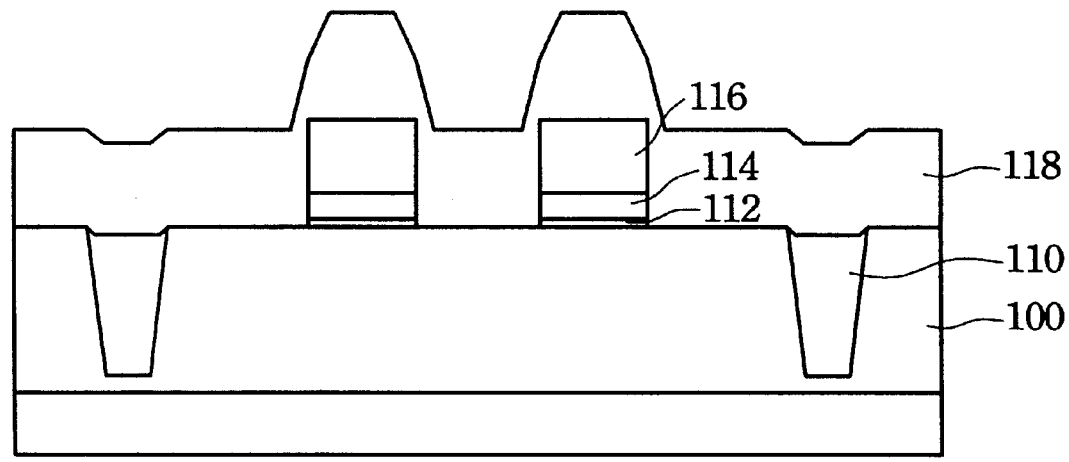

According to the above-mentioned, the present invention utilizes a new design of circuit layout to enhance the structure strength of the above-mentioned semiconductor device. FIGS. 3A–3F are schematically illustrated to show cross-sectional views of fabricating a flash memory cell according to the application of the present invention. Referring to FIG. 3A, a semiconductor substrate 100 is shown and the substrate 100 can be such as a p-type doped silicon substrate with <100> lattice structure. An isolating structure 110 is fabricated in the substrate 100 to layout the active regions for each memory cell. The isolating structure 110 can be a field oxide layer formed by LOCOS method, and preferably be a shallow trench isolation (STI) structure, as shown in FIG. 3A.

A gate oxide layer 112, a conductive layer 114 and a dielectric layer 116 are formed in sequence on the substrate 100. The gate oxide layer 112 can be formed by thermal oxidation technology with a thickness of about 30–150 angstroms. The conductive layer 114 can be a polysilicon layer, formed by low pressure chemical vapor deposition (LPCVD) at a temperature of about 600–650° C. with a thickness of about 500–1500 angstroms. The conductive layer 114 can be a polysilicon layer, or a doped polysilicon layer. In addition, the nitride layer 116 can be formed by CVD with a thickness of about 1100–2400 angstroms. The stacked layer that includes the gate oxide layer 112, the polysilicon layer 114 and the nitride layer 116 is then patterned by conventional photolithography and etching technology to define a desired pattern. Undesired portions of the stacked layer are removed to form a plurality of linear stacked layers, as shown in FIG. 3A.

Referring to FIG. 3B, an insulating layer 118, such as an oxide layer, is formed over the substrate 100. The insulating layer 118 is preferably a HDP oxide layer with a thickness of about 1.5–3.5 kilo-angstroms formed by high density plasma chemical vapor deposition (HDP-CVD) of which mainly depositing in vertical direction to obtain a dense structure. Specifically, the thickness of the insulating layer 118 over the corners of the dielectric layer 116 is just about 300–500 angstroms because of the insulating layer 118 formed by HDP-CVD method.

Figure 3C:
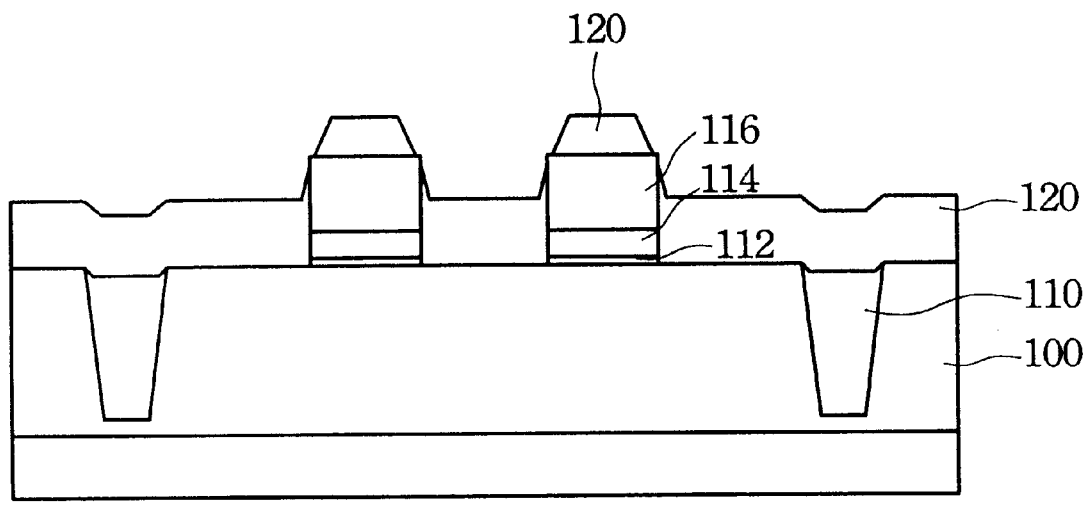

Referring to FIG. 3C, portion of the insulating layer 118 is removed until a desired thickness of the insulating layer 120 is obtained. The resulting insulating layer 120 has a thickness little larger than the thickness of the polysilicon layer 114, and can be a thickness of about 0.5–2 kilo-angstroms. The insulating layer 120 can be formed by wet dip etching with time control to obtain desired thickness. The insulating layer 120 also can be formed by reactive ion etching (RIE). The top corners of the nitride layer 116 are exposed when the insulating layer 120 is formed by wet dip etching the insulating layer 118, with just about 300–500 angstroms over the corners of the nitride layer 116.

Figure 3D:
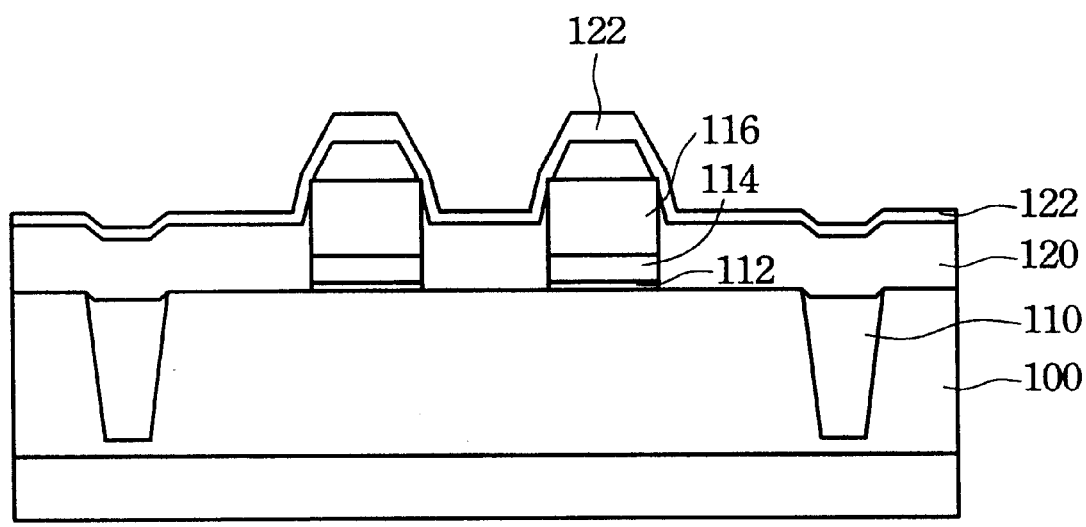
Figure 3:
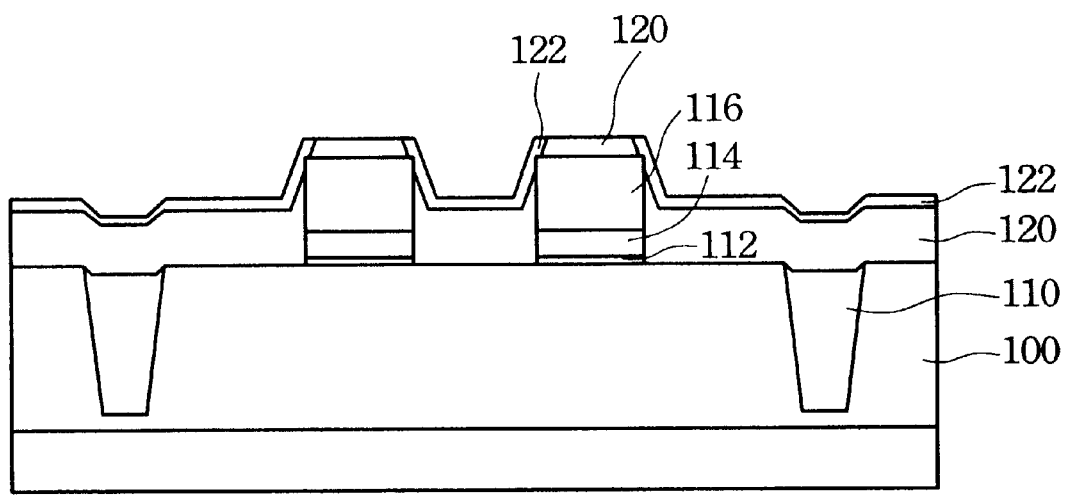
Figure 3:
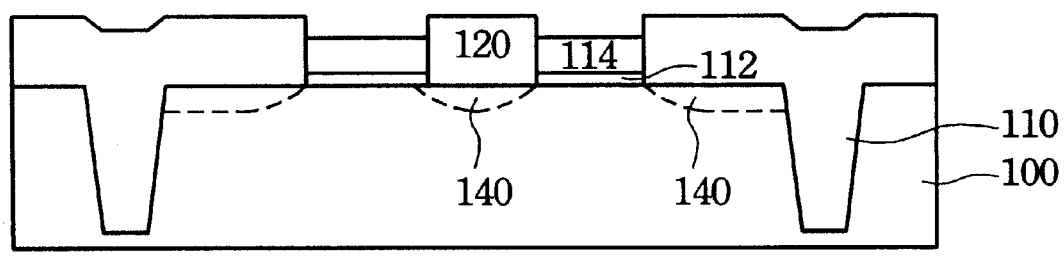

Referring to FIG. 3D, a cap layer of silicon nitride 122 is formed over the HDP oxide layer 120 and the corners of the silicon nitride layer 116. Because the corners of the silicon nitride layer 116 have been exposed, the cap layer of silicon nitride 122 can be combined together to sufficiently isolate the HDP oxide layer on top of the silicon nitride layer 116 from the HDP oxide layer beside the gate oxide layer 112, the polysilicon layer 114 and the silicon nitride layer 116.

Figure 4:
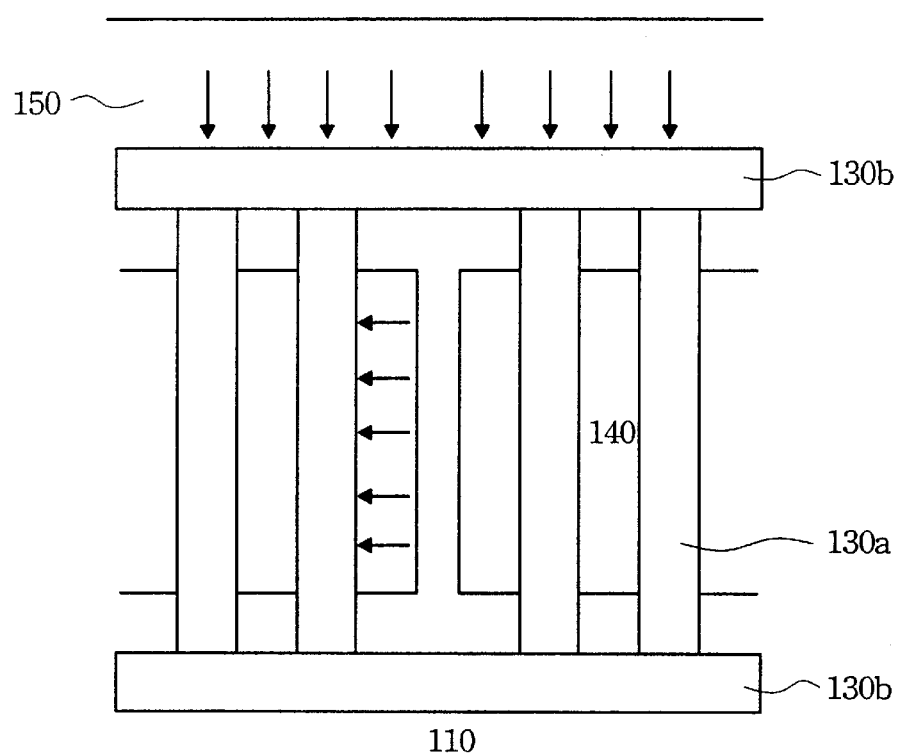
FIG. 4 schematically illustrates a top view of FIG. 3F.

Referring to FIG. 3E, a chemical mechanical polishing process is subsequently proceeding. In order to overcome the disadvantage of easily generating defects in the CMP process, the present invention forms the same linear stacked layers simultaneously with the circuit structure as illustrated in FIGS. 3A–3D, with the gate oxide layer 112, the polysilicon layer 114 and the silicon nitride layer 116 on the boundary between the wafer's active regions. The linear stacked layers on the wafer's active regions are a plurality of convex strips of a first circuit structure 130a, while two linear stacked layers on the boundary of the semiconductor wafer are a second circuit structure 130b for linking the front ends and the rear ends of the plurality of strips of the first circuit structure 130a, as shown in FIG. 4. Because the first circuit structure 130a has the same dielectric and conductive layers with the second circuit structure 130b, the structure strength or the rigidity of both front and rear ends of the first circuit structure 130a can be effectively enhanced, and thus the polishing pressure can be sufficiently averaged in the CMP process, as arrows shown in FIG. 4.

Please continue to refer FIG. 3E, the HDP oxide layer 120 is utilized as a stop layer to remove the cap layer 122 in the CMP process. It is noted again that the HDP oxide layer 120 will not be destroyed as the first circuit structure 130a shown in FIG. 2A after the CMP process of removing the cap layer 122.

Referring to FIG. 3F, remove the residue HDP oxide layer 120 upon the silicon nitride layer 116 first, and then, remove the cap layer 122 and the silicon nitride layer 116 by utilizing high selective wet etching without any damage on other exposed regions. At last, the remaining parts on the wafer include the substrate 100, the HDP oxide layer 120, the polysilicon layer 114 and the pad oxide 112 thereon. An ion implantation process is proceeding subsequently to form diffusion regions 140.

Figure 1:
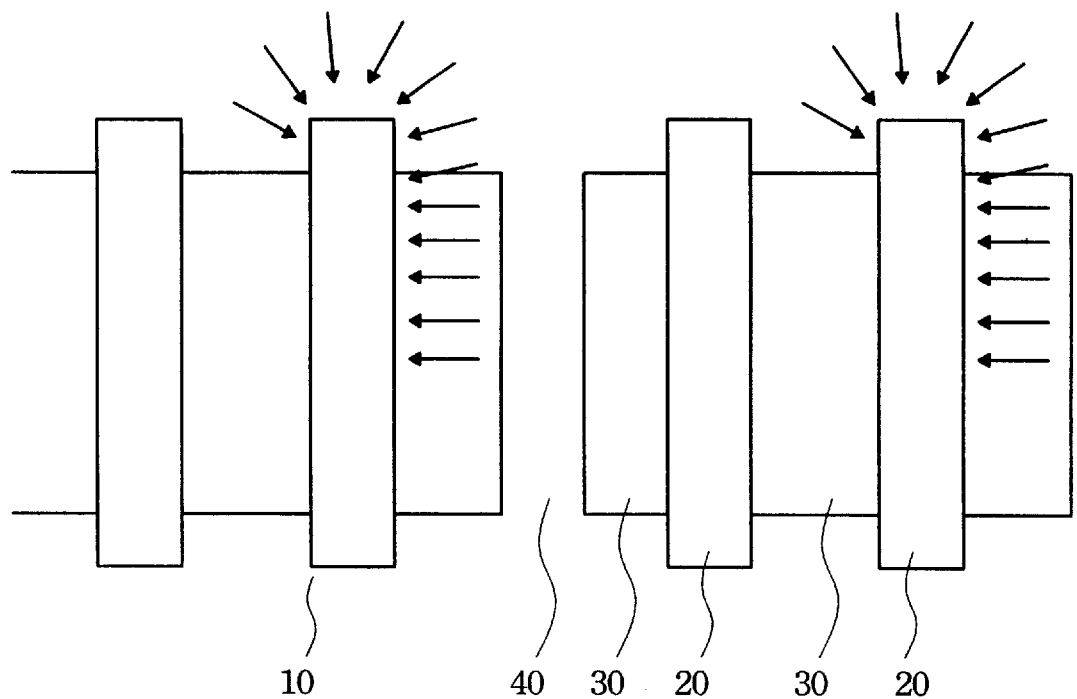
FIG. 1 schematically illustrates a top view diagram to show dielectric and conductive layers convex upon a semiconductor wafer.

Please refer to FIG. 4 again. FIG. 4 schematically illustrates a top view of FIG. 3F. Compared above mentioned with FIG. 1, the polishing pressure, on the front and rear ends of the circuit structure 20, comes from different directions. Thus the stresses on the front and rear ends are larger than on the other parts and result in defects formed thereon. On the other hand, as shown in FIG. 4, the polishing pressure, on the front and rear ends on the first circuit structure 130a is accordingly much uniform than that shown in FIG. 1 for the sake of structure improvement by the second circuit structure 130b. As a result, the possibility of generating defects in the CMP process will sufficiently decrease.

It should be noted that the location of the second circuit structure 130b of the present invention is a boundary 150 between active regions. Thus, the pattern density of active regions of semiconductor wafers will not be changed. In general, the width of the wafer's boundary 150 is about 1.5 μm, while the width of the second circuit structure 130b of the present invention is about 0.3 μm. Moreover, in a global view of the wafer's circuit layout revealed by the present invention, the active region, having a plurality of convex circuit strips 130a, could be applied with two circuit structures 130b on the boundary 150 repeatedly to link the front end and the rear end of the circuit strips 130a. The above-mentioned circuit structure is only a preferred embodiment of the present invention, but not to limit it.

Figure 5:
FIG. 5–FIG. 6 schematically illustrates comparison of defects of the traditional circuit layout and of the present invention formed after the CMP process.
Figure 6:
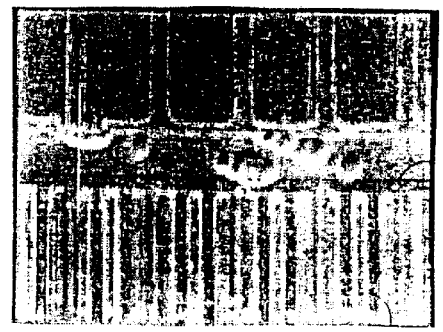

Finally, refer to FIG. 5–FIG. 6, while several defects are formed on the front ends of the traditional circuit layout shown in FIG. 5 according to the polishing pressure exerted thereon. On the contrary, in FIG. 6, the circuit layout of the present invention, with an aid of the second circuit structure on the boundary linking the front and the rear ends of the first circuit structure, can sufficiently reduce defects of the CMP process. As shown in FIG. 6, although a few defects are formed, the defects are only limited to form on the second circuit structure on the boundary. The first circuit structure on wafer's active regions is still protected effectively well so that the desired performance of the semiconductor wafer can be achieved.

Although the invention has been described in detail herein with reference to its preferred embodiment, it is to be understood that this description is by way of example only, and is not to be interpreted in a limiting sense. It is to be further understood that numerous changes in the details of the embodiments are included within the spirit and scope of the present invention. Additional embodiments of the invention will be apparent, and may be made by persons of ordinary skill in the art, having reference to this description. It is understood that such changes and additional embodiments are within the spirit and true scope of the invention as claimed below.

We claim:

1. A circuit layout on a substrate of a semiconductor wafer, suitable for reducing defects during a chemical mechanical polishing process, said substrate comprising a plurality of strips of first circuit structure, said circuit layout comprising:

at least two strips of second circuit structure located on said substrate of said semiconductor wafer, each of said two strips of second circuit structure respectively linking the front end and the rear end of said plurality of strips of said first circuit structure, utilizing to average polishing pressure performed upon the front end and the rear end of said plurality of strips of said first circuit structure during said chemical mechanical polishing process for reducing defects occurred.

2. The circuit layout as recited in claim 1, wherein said first circuit structure is located on an active region of said semiconductor wafer.

3. The circuit layout as recited in claim 2, wherein said substrate of said semiconductor wafer among said first circuit structure are diffusion regions.

4. The circuit layout as recited in claim 1, wherein said second circuit structure is located on a boundary between said active regions of said semiconductor wafer.

5. The circuit layout as recited in claim 4, wherein the width of said boundary is about 1.5 μm.

6. The circuit layout as recited in claim 1, wherein the width of said second circuit structure is about 0.3 μm.

7. The circuit layout as recited in claim 1, wherein said first circuit structure and said second circuit structure comprises a conductive layer and an insulating layer, located upon said conductive layer.

8. The circuit layout as recited in claim 7, wherein said conductive layer further comprises a polysilicon layer.

9. The circuit layout as recited in claim 7, wherein said insulating layer further comprises a silicon nitride layer.

* * * * *